US012716970B2

(12) United States Patent
Strelkov et al.

(10) Patent No.: US 12,716,970 B2
(45) Date of Patent: Aug. 25, 2026

(54) METHOD TO CALCULATE PERFORMANCE OF A MAGNETIC ELEMENT COMPRISING A FERROMAGNETIC LAYER EXCHANGE-COUPLED TO AN ANTIFERROMAGNETIC LAYER

(71) Applicant: Allegro MicroSystems, LLC, Manchester, NH (US)

(72) Inventors: Nikita Strelkov, Meylan (FR); Andrey Timopheev, Vif (FR); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 419 days.

(21) Appl. No.: 18/555,075

(22) PCT Filed: Apr. 4, 2022

(86) PCT No.: PCT/IB2022/053104
§ 371 (c)(1),
(2) Date: Oct. 12, 2023

(87) PCT Pub. No.: WO2022/219454
PCT Pub. Date: Oct. 20, 2022

(65) Prior Publication Data

US 2024/0210498 A1 Jun. 27, 2024

(30) Foreign Application Priority Data

Apr. 13, 2021 (EP) .................................... 21315065

(51) Int. Cl.
*G01R 33/09* (2006.01)
*G01R 33/12* (2006.01)
(Continued)

(52) U.S. Cl.
CPC ......... *G01R 33/093* (2013.01); *G01R 33/098* (2013.01); *G01R 33/1284* (2013.01);
(Continued)

(58) Field of Classification Search
CPC ................ G01R 33/093; G01R 33/098; G01R 33/1284; H10N 50/10; H01F 10/3268; G11C 11/161
See application file for complete search history.

(56) References Cited

U.S. PATENT DOCUMENTS 7,738,220 B1 * 6/2010 Fukuzawa ............ G11B 5/3932 360/324.12
2011/0175605 A1 * 7/2011 Kim ...................... G01R 33/07 324/251
2014/0334032 A1 11/2014 Nishioka

FOREIGN PATENT DOCUMENTS

WO WO 2019/171660 A1 9/2019

OTHER PUBLICATIONS

Japanese Office Action (with English Translation) dated Dec. 10, 2025 for Japanese Application No. 2023-562726; 9 Pages.
(Continued)

*Primary Examiner* — Lex H Malsawma
(74) *Attorney, Agent, or Firm* — DALY, CROWLEY, MOFFORD & DURKEE, LLP

(57) ABSTRACT

A method to calculate performance of a magnetic element including a reference bilayer including a ferromagnetic reference layer having a reference magnetization and an antiferromagnetic layer pining the reference magnetization by exchange-bias, the antiferromagnetic layer including a metallic polycrystalline material having a grain volume distribution; the method including: measuring an exchange-bias field (Hex) of the antiferromagnetic layer as a function of temperature; fitting a grain volume distribution function to the measured exchange-bias fields (Hex) to determine
(Continued)

parameters characterizing the volume distribution function; calculating a variation in the direction of the reference magnetization as a function of a direction of an exposure magnetic field (H); and calculating the exchange bias field (Hex) for any value of the in-plane exposure field (H).

13 Claims, 5 Drawing Sheets

(51) Int. Cl.
*H01F 10/32* (2006.01)
*H10N 50/10* (2023.01)
*G11C 11/16* (2006.01)

(52) U.S. Cl.
CPC ......... *H01F 10/3268* (2013.01); *H10N 50/10* (2023.02); *G11C 11/161* (2013.01)

(56) References Cited

OTHER PUBLICATIONS

Korean Office Action (with English Translation) dated Dec. 12, 2025 for Korean Application No. 10- 2023-7038371; 5 Pages.

Vallejo-Fernandez et al., Antiferromagnetic grain volume effects in metallic polycrystalline exchange bias systems; J. Phys. D. Appl. Phys. No. 41 (2008), pp. 1-5, May 8, 2009.

Soeya, et al., Distribution of blocking temperature in bilayered Ni(81)Fe(19)/NiO films; J. Appl. Phys. vol. 76, No. 9, pp. 5356-5360, Nov. 1, 1994.

O'Grady, et al., A new paradigm for exchange bias in polycrystalline thin films; Journal of Magnetism and Magnetic Materials, 322 (2010) pp. 883-899, Dec. 16, 2009.

The International Search Report and Written Opinion issued in corresponding International PCT Application No. PCT/IB2022/053104; Mailing Date: Jun. 28, 2022.

Japanese Notice of Allowance (with Machine English Translation from Espacenet.com) dated Feb. 27, 2026 for Japanese Application No. 2023-562726; 8 Pages.

Response (with Machine English Translation) Japanese Office Action dated Dec. 10, 2025 for Japanese Application No. 2023-562726; Response Filed Feb. 16, 2026; 16 Pages.

Response (with Machine English Translation) to Korean Office Action dated Dec. 12, 2025 for Korean Application No. 10-2023-7038371; Response Filed Feb. 4, 2026; 14 Pages.

* cited by examiner

METHOD TO CALCULATE PERFORMANCE OF A MAGNETIC ELEMENT COMPRISING A FERROMAGNETIC LAYER EXCHANGE-COUPLED TO AN ANTIFERROMAGNETIC LAYER

TECHNICAL DOMAIN

The present invention concerns methods for determining degradation dependencies of electrical and magnetic parameters in magnetic elements, such as magnetic sensors.

RELATED ART

GMR or TMR-based magnetic devices such as magnetic field sensors, magnetic random-access memory (MRAM) or spin-torque nano-oscillators often comprise a ferromagnetic layer exchange coupled to an antiferromagnetic layer. The phenomenon of exchange bias, which occurs due to the exchange coupling between the ferromagnetic layer and the antiferromagnetic layer, makes it possible to improve the stability of the magnetic device.

Thermal stability within the antiferromagnetic layer is a key parameter to achieve a working magnetic device. During typical operation, the magnetic device may be exposed to strong magnetic fields and high temperatures. Thermal relaxation effects during such exposure can result in shifts in the magnetic device properties. It is therefore important to predict the expected degradation of the magnetic device under specific exposure conditions.

Various models have been proposed to estimate the thermal stability of exchange bias in the ferromagnetic and antiferromagnetic layers, based on the polycrystalline antiferromagnetic layer structure and thermal fluctuations (see for example: G Vallejo-Fernandez et al 2008, *J. Phys. D: Appl. Phys.* 41 112001). In these models, the grain anisotropy axis of the polycrystalline antiferromagnetic layer is assumed to be oriented in only one direction such that the free energy of each grain does not depend on the direction of the ferromagnetic layer magnetization. It is not possible in this case to properly account for the effect of angular variation of an external magnetic field applied on the ferromagnetic and antiferromagnetic layers.

SUMMARY

The present disclosure concerns a method to determine degradation dependencies of electrical and magnetic parameters in TMR magnetic field sensor under accelerated lifetime test (ALT). The method calculates deviations (degradation) over time of initial exchange bias direction and strength due to high temperature and/or magnetic field. It is then possible to estimate the effect on final output parameters of a TMR sensor (linearity, angular error, sensitivity, offset etc.). The method is based on the polycrystalline model of antiferromagnet and Arrhenius's concept of thermal activation energy using a novel self-consistent recursion procedure.

According to an embodiment, a method to calculate performance of a magnetic element comprising a reference bilayer including a ferromagnetic reference layer having a reference magnetization and an antiferromagnetic layer pinning the reference magnetization by exchange-bias, the antiferromagnetic layer comprising a metallic polycrystalline material having a grain volume distribution; the method comprising: measuring an exchange-bias field of the antiferromagnetic layer at selected exposure temperatures, under selected in-plane exposure magnetic fields and exposure time applied to the reference bilayer; fitting a grain volume distribution function to the measured exchange-bias fields to determine at least one distribution parameter characterizing the volume distribution of the grains and at least one magnetic parameter characterizing the magnetic properties of the antiferromagnetic layer; calculating a reference angle corresponding to an in-plane variation in the direction of the reference magnetization, as a function of a direction of the exposure magnetic field; and calculating the exchange bias field for any value of the in-plane exposure magnetic field, exposure temperature and exposure time, using the calculated reference angle and determined said at least one distribution and magnetic parameters in the grain volume distribution function.

The present disclosure further concerns a computer program product comprising instructions which, when the program is executed by a computer, cause the computer to carry out the method.

The method disclosed herein can predict the properties of a magnetic element, such as a magnetic sensor, including sensitivity, linearity, and angular error over time under ALT test. The properties can be predicted rapidly and in both short and long-time term working conditions, therefore allowing estimating the lifetime of the magnetic element with given specifications. In particular, the properties can be predicted over a longer time interval (years) than ALT measurements (hours) and therefore improve prediction of a full lifetime period.

The method can be applied to any magnetic elements comprising spintronic devices based on antiferromagnet/ferromagnet interface with exchange bias pinning, such as (MRAM, field sensors, spin-torque nano-oscillators, under different exposure conditions such as magnetic field, temperature and time. The method takes into account the different in-plane orientation of the uniaxial anisotropy of each grain of the antiferromagnetic layer. The method can therefore contribute, together with specific device models and usage cases, to evaluating potential lifetime performance shifts in such magnetic elements.

SHORT DESCRIPTION OF THE DRAWINGS

Exemplar embodiments of the invention are disclosed in the description and illustrated by the drawings in which.

Figure 4:
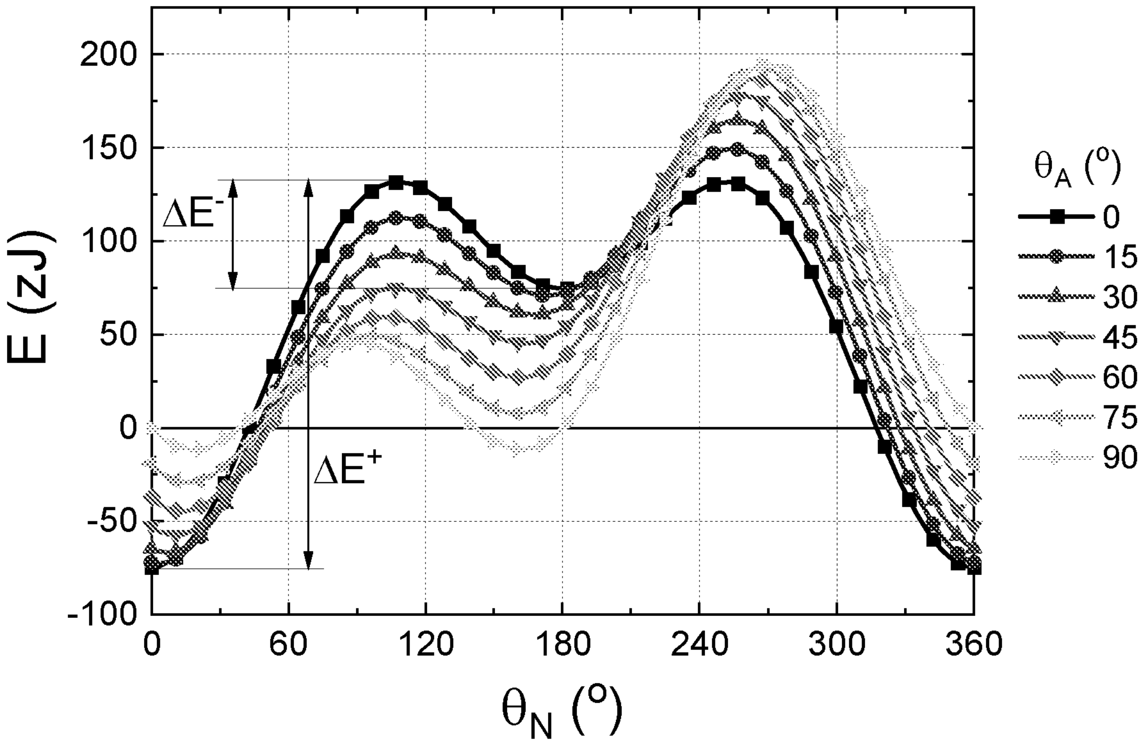
Figure 5:
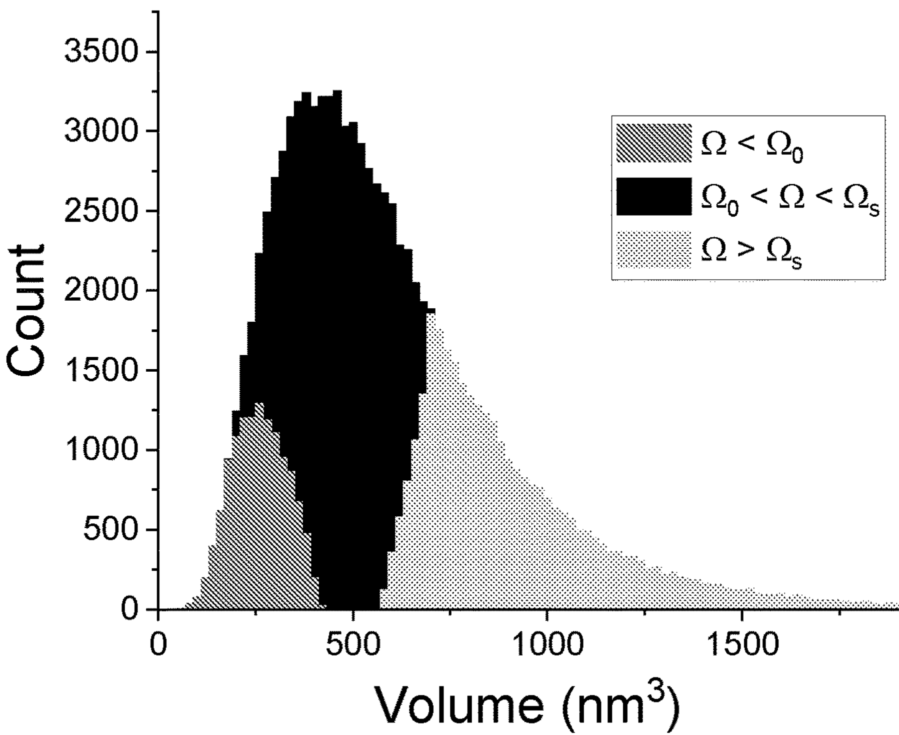
Figure 6:
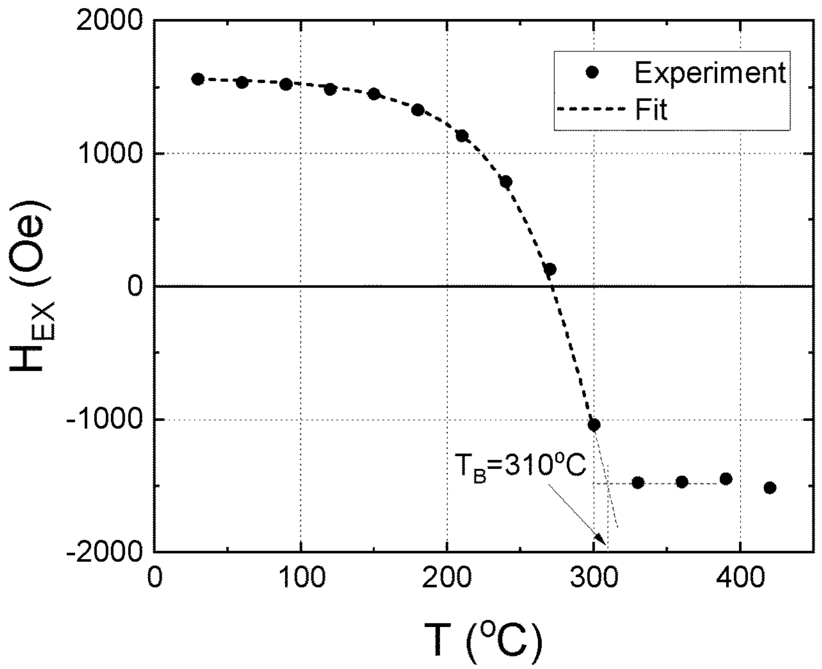
Figure 7:
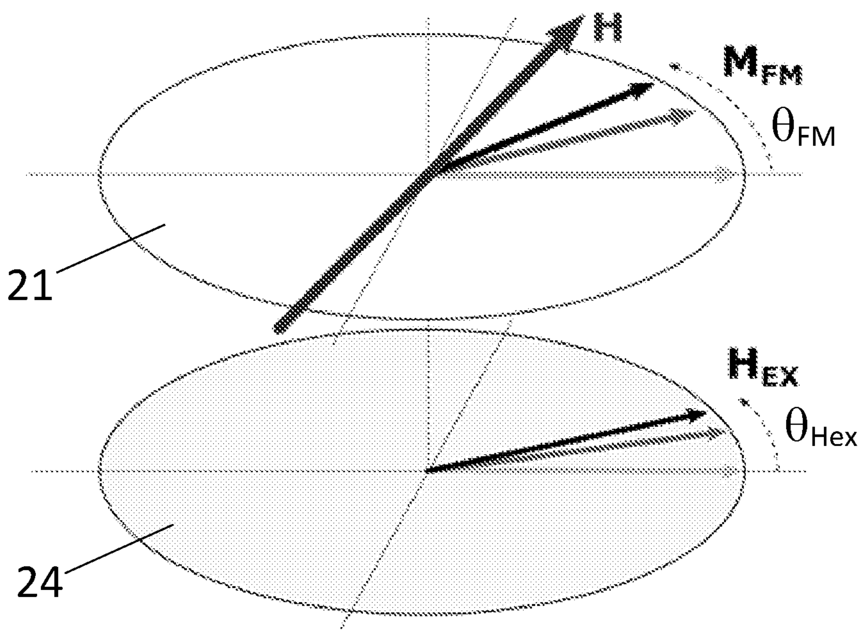
Figure 8:
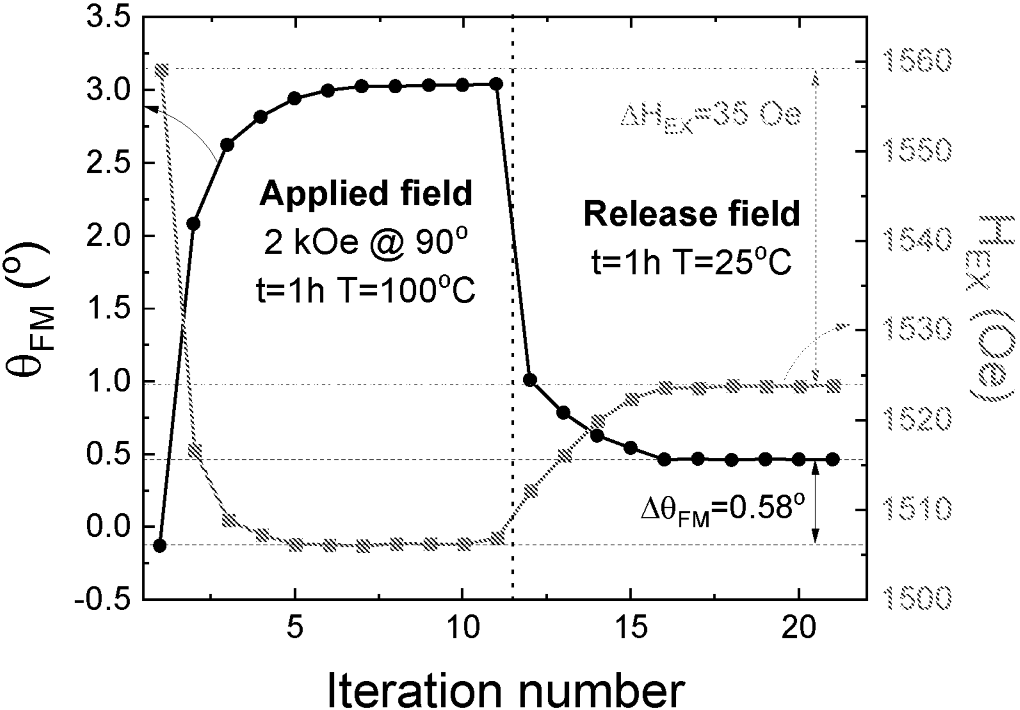
Figure 9:
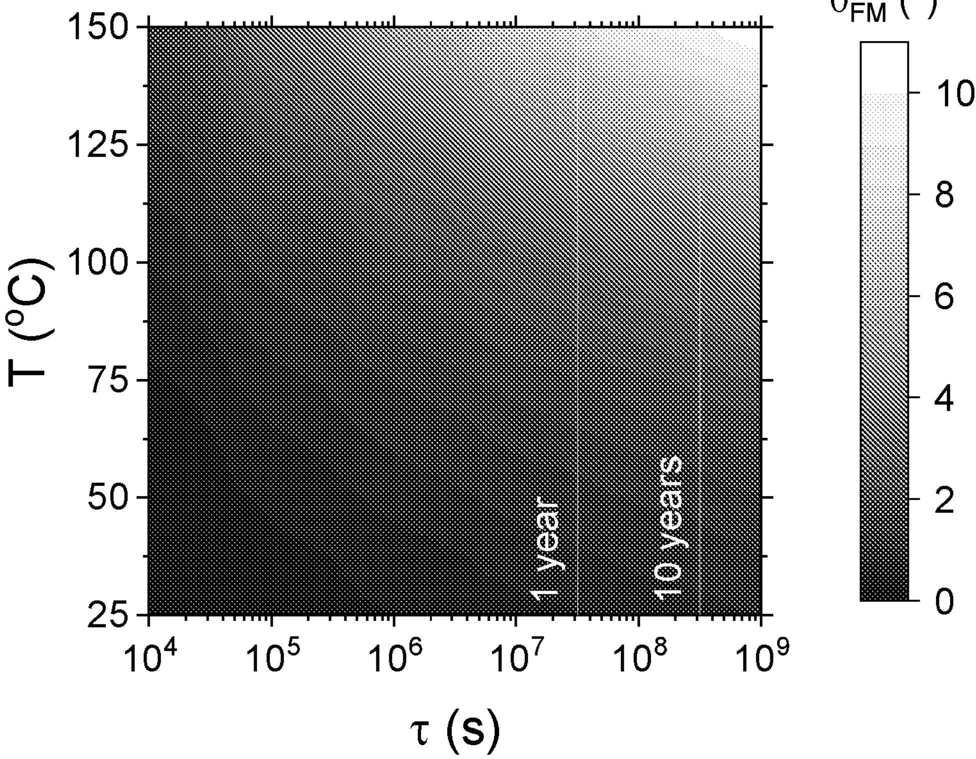

FIG. 4 reports energy profiles for different orientations of uniaxial anisotropy angle of a grain;

FIG. 5 shows a histogram of a volume distribution of the grains;

FIG. 6 reports measured exchange bias field as a function of temperature in a sputter-deposited CoFe reference ferromagnetic layer and IrMn antiferromagnetic layer;

FIG. 7 illustrates an iterative procedure to converge to a magnetic state of the reference bilayer;

FIG. 8 shows the results of the iterative procedure for a specific example;

FIG. 9 shows an example of a temperature versus time diagram of the reference bilayer.

EXAMPLES OF EMBODIMENTS

Figure 1:
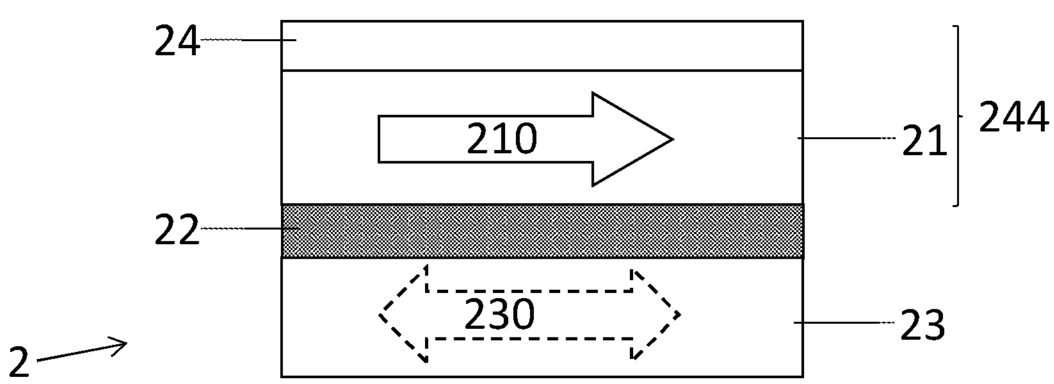
FIG. 1 illustrates schematically a TMR-based magnetic element comprising a reference bilayer including a reference ferromagnetic layer and an antiferromagnetic layer.

FIG. 1 shows a TMR-based magnetic element 2 comprising a reference bilayer 244 including an antiferromagnetic layer 24 and a reference ferromagnetic layer 21 having a reference magnetization 210, wherein the antiferromagnetic layer 24 pins the reference magnetization 210 by exchange-bias. The magnetic element 2 further comprises a sense ferromagnetic layer 23 having a sense magnetization 230 that can be switched relative to the first magnetization 210. A tunnel barrier layer 22 is comprised between the reference ferromagnetic layer 21 and the sense ferromagnetic layer 23. The antiferromagnetic layer 24 can pin the reference magnetization 210 along a pinned direction through an exchange-bias field $H_{ex}$ coupling at a temperature below a threshold temperature. The threshold temperature can correspond to a blocking temperature, which is below the Neel temperature. The magnetic element 2 is not limited to a TMR-stack but can include any magnetic device such as GMR or TMR-based magnetic device including a magnetic field sensor, a magnetic random-access memory (MRAM) or a spin-torque nano-oscillator, as long as it includes a ferromagnetic layer pinning the magnetization of a ferromagnetic layer. Moreover, the expression "reference ferromagnetic layer" can be generalized to any ferromagnetic layer.

The reference layer 21 can comprise one or a plurality of ferromagnetic layers or a synthetic antiferromagnet (SAF). The antiferromagnetic layer 24 can comprise an alloy based on manganese Mn, such as alloys based on iridium Ir and Mn (e.g., IrMn); alloys based on Fe and Mn (e.g., FeMn); alloys based on platinum Pt and Mn (e.g., PtMn); and alloys based on Ni and Mn (e.g., NiMn). The antiferromagnetic layer 24 comprising a metallic polycrystalline material having a grain volume distribution.

The reference and sense layers 21, 23 can be made of a ferromagnetic material such as Fe based alloy, CoFe, NiFe or CoFeB. The tunnel barrier 22 can comprise an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 3 nm.

Figure 2:
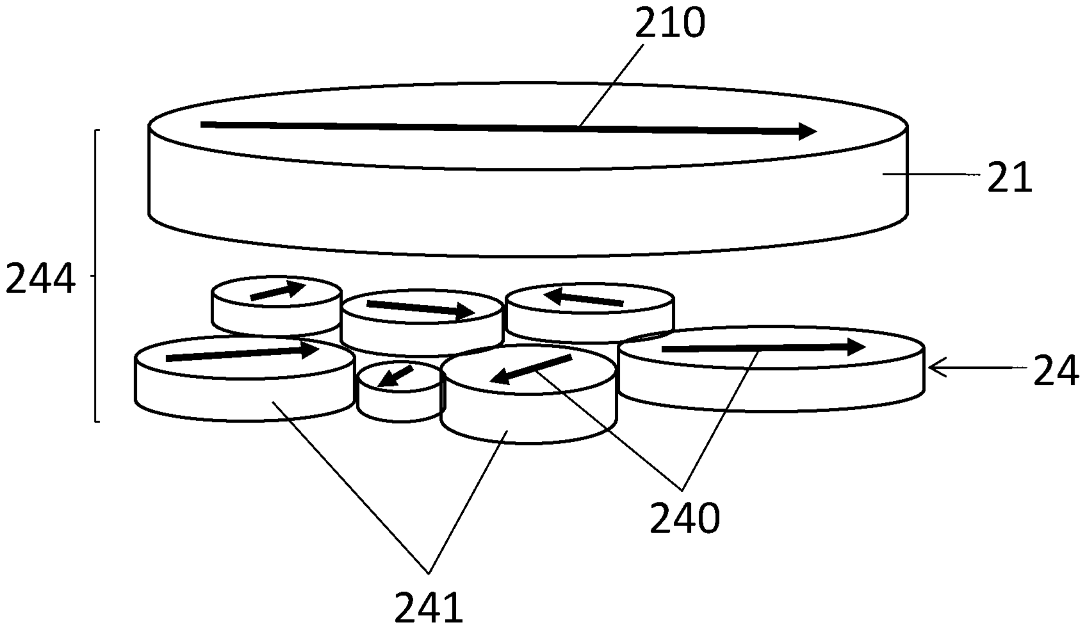
FIG. 2 represents schematically a reference ferromagnetic layer and a polycrystalline antiferromagnetic layer.
Figure 3:
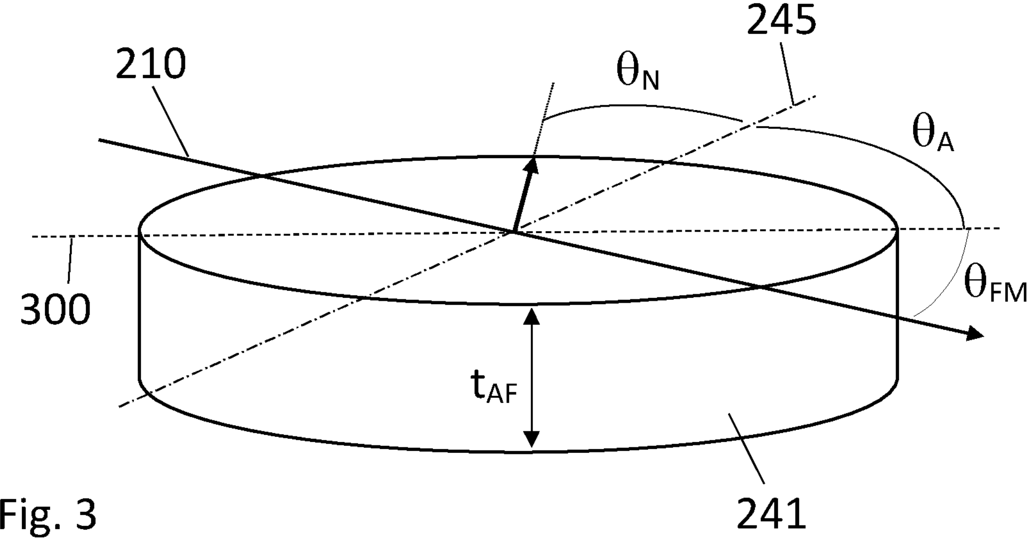
FIG. 3 represents a single grain of the polycrystalline antiferromagnetic layer.

FIG. 2 represents schematically a reference ferromagnetic layer 21 and a polycrystalline antiferromagnetic layer 24 having a thickness $t_{AF}$. The antiferromagnetic layer 24 comprises a plurality of grains 241 of various size and volume. FIG. 3 represents a single grain 241. Each grain 241 has a magnetic moment represented by the Néel vector 240 and oriented at a Néel vector angle $\theta_N$. Uniaxial anisotropy axis 245 of each grain 241 is defined by the anisotropy angle $\theta_A$. At the interface between the antiferromagnetic layer 24 and the reference ferromagnetic layer 21, the grains 241 are coupled with the reference ferromagnetic layer 21, which is uniformly magnetized. The reference magnetization 210 is oriented with a reference angle $\theta_{FM}$. The Néel vector angle $\theta_N$, anisotropy angle $\theta_A$ and reference angle $\theta_{FM}$ can be defined relative to a reference axis 300.

In an embodiment, a method to calculate performance of the magnetic element 2 comprises the steps of:

- measuring an exchange-bias field $H_{ex}$ of the antiferromagnetic layer 24 at selected exposure temperatures $T_S$, under selected in-plane exposure magnetic fields H applied to the reference bilayer 244, during an exposure time $\tau_S$;
- fitting a grain volume distribution function to the measured exchange-bias fields $H_{ex}$ to determine at least one distribution parameter characterizing the volume distribution of the grains and at least one magnetic parameter characterizing the magnetic properties of the antiferromagnetic layer 24;
- calculating a reference angle $\theta_{FM}$ corresponding to an in-plane variation in the direction of the reference magnetization 210, as a function of a direction of the exposure magnetic field H; and
- calculating the exchange bias field $H_{ex}$ for any value (amplitude and direction) of the in-plane exposure magnetic field H, exposure temperature $T_S$ and exposure time $\tau_S$, using the calculated reference angle $\theta_{FM}$ and determined said at least one distribution and magnetic parameters in the grain volume distribution function.

The selected in-plane exposure magnetic fields H can be high enough to saturate the reference ferromagnetic layer 21. The method takes into account the different in-plane orientation of the uniaxial anisotropy axis 245 of each grain 241 of the antiferromagnetic layer 24. Here, the expression "in-plane" means in the plane of the layer (reference layer 21 and/or antiferromagnetic layer 24).

The method calculates the thermal stability of exchange bias at the interface between the reference ferromagnetic layer 21 and antiferromagnetic layer 24. More particularly, the method calculates the angular deviation of exchange bias field $H_{ex}$ and its amplitude degradation under various conditions on external magnetic field (exposure magnetic field H), temperature (exposure temperature T), and time (exposure time $\tau_S$).

The total energy E of an antiferromagnetic grain shown in FIG. 1 is given by the Equation (1):

$$E = K_u\Omega\sin^2(\theta_N - \theta_A) - \frac{J_E}{t_{AF}}\Omega\cos(\theta_N - \theta_{FM}) \tag{1}$$

where $K_u$ is the uniaxial anisotropy constant at an anisotropy angle $\theta_A$, $\Omega$ is the grain's volume, $J_E$ is the interface coupling constant, $t_{AF}$ is the thickness of the antiferromagnetic layer 24, $\theta_N$ is the Néel vector angle, and $\theta_{FM}$ is the reference angle.

Energy profiles obtained from Equation (1) for different orientations of uniaxial anisotropy angle $\theta_A$ are shown in FIG. 4. The energy barriers between two metastable states of a grain 241 can be calculated from the derivative of Equation (1). If the anisotropy angle $\theta_A$ is equal to zero, the approximate expression for the barriers $\Delta E^+$ and $\Delta E^-$ reduces to Equation (2):

$$\Delta E_\Omega^{\pm} = \frac{\Delta E^{\pm}}{\Omega} \approx K_u + \frac{J_E^2}{4K_u t_{AF}^2} \pm \frac{\sqrt{2}J_E}{t_{AF}}\cos\left(\theta_{FM} \pm \frac{\pi}{4}\right). \tag{2}$$

The corresponding time $\tau^{\pm}$ for a grain to overcome the energy barrier $\Delta E^{\pm}$ during thermal fluctuations is given by the Néel-Arrhenius law Equation (3):

$$\frac{1}{\tau^{\pm}} = v_0 e^{-\frac{\Delta E^{\pm}}{k_B T}}, \tag{3}$$

where T is a temperature, $v_0$ is an attempt frequency of the order of $10^9$ $s^{-1}$ and $k_B$ is the Boltzmann constant.

Temperature dependence of the anisotropy constant $K_0$ and interface exchange energy $J_0$ at 0° K follow the power law $$K_u = K_0(1 - T/T_N),$$

$$J_E = J_0(1 - T/T_N)^{0.33},$$

where $T_N$ is the Néel temperature of the antiferromagnetic layer 24.

The grain volume distribution function is assumed to follow a lognormal function such as in Equation (4):

$$f(\Omega) = \frac{1}{\sqrt{2\pi}\sigma\Omega} e^{-\frac{(\log\Omega-\mu)^2}{2\sigma^2}} \tag{4}$$

Where σ is the standard deviation and μ is the mean value. Assuming that the reference bilayer 244 is exposed to external disturbances over time (for example, annealing at elevated temperatures followed by cooling in a magnetic field) which change the energy of the grains 241. The resulting exchange bias field $H_{ex}$ can be calculated using Equation (5):

$$H_{ex} = H_0 \int_{\Omega^{\pm}(\tau)} f(\Omega) d\Omega \tag{5}$$

where $H_0$ is the total available exchange bias value if all grains contribute fully, $\Omega_{\pm}$ (τ) are the volumes of the grains 241 that satisfy the condition, where $\Omega_o<\Omega<\Omega_S$, where:

$$\Omega_0 = \frac{k_B T_0}{\Delta E^{+}_{\Omega}(T_0)} \log v_0 \tau_c,\ \Omega_s = \frac{k_B T_s}{\Delta E^{-}_{\Omega}(T_s)} \log v_0 \tau_s, \tag{6}$$

where $\Omega_0$ is a critical volume at room temperature, $\Omega_S$ is a critical volume at setting temperature, $T_0$ is room temperature, $T_S$ is the exposure (annealing) temperature, $\tau_S$ is the exposure time, and $\tau_c$ is the time elapsed after exposure (sum of cooling time and measurement time).

Since in the present method a random direction of the anisotropy in the grains 241 is considered, Equation (5) cannot be directly used. To simulate the reference ferromagnetic layer 21 and the antiferromagnetic layer 24, an array of grains 241 must be generated respecting the volume distribution of Equation (4) and with randomly oriented uniaxial anisotropy 245.

In an embodiment, the method further comprises generating an array of grains 241 using determined at least one distribution parameter. The array of grains 241 having a volume corresponding to the one the antiferromagnetic layer 24. The at least one distribution parameter can comprise mean value μ and standard deviation a of the grain volume distribution function.

In an example, all the grains 241 in the array can have a randomly oriented uniaxial anisotropy with an anisotropy angle $\theta_A$between 0° and 180°. The lognormal distribution was calculated the mean value μ=6.28 and the standard deviation σ=0.52.

To calculate the resulting exchange bias field $H_{ex}$ after exposure (to an exposure magnetic field H and exposure temperature $T_S$), Equation (5) can be replaced by the summation over the contributing grains 241, i.e., the grains 241 that contribute to the exchange bias field $H_{ex}$. In FIG. 5, the histogram of the volume distribution is shown comprising three regions: a first region R1 corresponding to small thermally unstable grains ($\Omega<\Omega_0$) that do not contribute to exchange bias field $H_{ex}$, a second region R2 corresponding to large stable grains ($\Omega_0>\Omega>\Omega_S$) that also do not contribute to the exchange bias field $H_{ex}$, and a third region R3 corresponding to grains matching the condition $\Omega_0<\Omega<\Omega_S$ and responsible for the observed exchange bias $H_{ex}$. The boundaries of the three regions R1, R2, R3 are not straight since the critical volumes $\Omega_0$ and $\Omega_S$ depend on the orientation of the anisotropy axis 245. Therefore, a summation over the grains in the second region R2 yields the value of the exchange bias field $H_{ex}$.

In an embodiment, the method is applied to a specific reference ferromagnetic layer 21 and antiferromagnetic layer 24 and the properties of the layers 21, 24 are estimated for various exposure conditions (to an exposure magnetic field H and exposure temperature $T_S$). This is achieved by determining the parameters of the grain volume distribution of the polycrystalline antiferromagnetic layer 24.

In one aspect, the grain volume distribution is determined by fitting experimentally measured exchange bias field $H_{ex}$ as a function of temperature T.

FIG. 6 reports measured exchange bias field $H_{ex}$ as a function of temperature T in a sputter deposited CoFe reference ferromagnetic layer 21 and IrMn antiferromagnetic layer 24. The measurements were performed using a protocol similar to that described in S. Soeya, et al., *J. Appl. Phys.*, vol. 76, no. 9, pp. 5356-5360, Nov. 1994. In particular, the measurements comprise the steps of:

- heating the reference bilayer 244 to a setting temperature $T_{set}$which does not result in interfacial diffusion, with a saturating magnetic field sufficient to saturate the antiferromagnetic layer 24 in the direction of the layer easy axis;
- cooling the reference bilayer 244 to a cooling temperature $T_{NA}$where no thermal activation occurs;
- reversing the polarity of the saturating magnetic field;
- heating the reference bilayer 244 to an activation temperature $T_{act}$ where thermal activation occurs;
- cooling the reference bilayer 244 to a cooling temperature $T_{NA}$;
- wait for an activation period of time $\tau_{act}$ and
- measure a hysteresis loop. The exchange bias field $H_{ex}$ being obtained from the shift of the hysteresis loop relative to the zero-field position.

Since there are only two opposite field directions used in the experiment, a simplified expression for the energy barrier Equation (2) can be used setting the reference angle $\theta_{FM}$ to zero. Using the explicit expression for the lognormal distribution of Equation (4) and its integral, the exchange bias field $H_{ex}$ in each $i^{th}$ experimental point can be calculated using Equation (7).

$$\int_{\Omega_0}^{\Omega_s} f(\Omega) d\Omega - 2\int_{\Omega_0}^{\Omega_a(T_i)} f(\Omega) d\Omega = \frac{H_{ex}(T_i)}{H_0}, \tag{7}$$

where the critical volume at room temperature $\Omega_0$ and the critical volume at setting temperature $\Omega_S$ depend on the cooling temperature $T_{NA}$, setting temperature $T_{set}$ and activation period of time $\tau_{act}$ in the measurement protocol. $\Omega_a(T_i)$ is the critical volume with the same form as Equation (6) but with the temperature of the $i^{th}$ experimental point and characteristic time $\tau_a$ corresponding to the exposure time of the inversed field in the protocol, and $H_{ex}$ ($T_i$) is a value of the exchange bias for the $i^{th}$ experimental point.

Since the distribution function of Equation (4) can be easily integrated, it is possible to adjust the unknown parameters: $H_0$, $T_N$, $K_0$, σ and μ. Note that parameter $H_0$ is close but slightly larger than the initial measurement point at room temperature, $T_N$ is about 400° C. for a IrMn antiferromagnetic layer. Here, the "initial point" corresponds to the first experimental point in FIG. 6, i.e., it corresponds to the exchange bias field $H_{ex}$ value after annealing in the high field during 90 min at 310° C. The parameter $K_0$ is about $10^6$ J/m$^3$ (G. Vallejo-Fernandez, et al., *J. Phys. D. Appl. Phys.*, vol. 41, no. 11, p. 112001). Distribution function parameters σ and μ can be adjusted with critical volumes defined in Equation (6) varying within acceptable ranges: 100 nm$^3$<$\Omega_0$<200 nm$^3$ and $\Omega_S$>700 nm$^3$.

After the above parameters $H_0$, $T_N$, $K_0$, σ and μ have been determined, it is possible to simulate the evolution of the exchange bias field $H_{ex}$ under specific exposure conditions including exposure temperature $T_S$, exposure magnetic field H, and exposure time $\tau_S$. Applying an in-plane exposure magnetic field H to the reference ferromagnetic layer 21 and IrMn antiferromagnetic layer 24 at a certain exposure angle $\theta_H$ relative to the reference axis 300 leads to a deviation of the orientation of the reference magnetization 210 (i.e., a variation in the reference angle $\theta_{FM}$). If one considers the reference magnetization 210 to be uniform (in the macrospin approximation), its direction will be aligned with the effective field, where the effective field is the sum of the external magnetic field H and the exchange bias field $H_{ex}$.

For a reference bilayer 244 comprising more than one reference ferromagnetic layer, it is necessary to use some numerical methods such as the Landau-Lifshitz-Gilbert equation to find the equilibrium angle. The ferromagnetic layers can be separated from each other by a thin paramagnetic layer (such as Ta, Pt, Ru). The equilibrium angle corresponds to a minimum energy of the magnetic system.

When the reference magnetization 210 orientation deviates from its initial direction (i.e., when there is a variation in the reference angle $\theta_{FM}$), the exchange bias field $H_{ex}$ can change since some of the grains 241 may switch their state. This will lead to an additional deviation of the orientation of the reference magnetization 210 orientation (i.e., a further variation in the reference angle $\theta_{FM}$).

In one aspect illustrated in FIG. 7, the method comprises an iterative procedure to converge to an equilibrium magnetic state, where the equilibrium magnetic state corresponds to a minimum of energy where the exchange bias field $H_{ex}$ no longer rotates. The iterative procedure can include the steps of:

- Performing an exposure step comprising applying an in-plane exposure magnetic field H oriented at an exposure angle $\theta_H$ (relative to the reference axis 300), at an exposure temperature $T_s$ and during an exposure time $\tau_S$;
- calculating the reference angle $\theta_{FM}$ of the reference magnetization 210 direction $M_{FM}$; and
- calculating the variation of the exchange bias field $H_{ex}$ amplitude and the variation of the exchange angle $\theta_{Hex}$.

The reference magnetization 210 magnetization direction $M_{FM}$ is aligned with the effective field vector corresponding to the sum of the exposure magnetic field H vector and the exchange bias field $H_{ex}$ vector.

The iterative procedure can comprise an initial step aimed at setting an initial exchange bias field $H_{ex}$ to the reference bilayer 244 (array of grains) and corresponding to the initial measurement point. The initial step can comprise applying an initial exposure magnetic field $H_{in}$ oriented at 0° (relative to the reference axis 300) at an initial exposure temperature $T_{in}$ during an initial exposure time $\tau_{Sin}$. Here, the initial exposure temperature $T_{in}$ can be between 290° C. and 310° C. and the initial exposure time $\tau_{Sin}$ can be 90 min.

The iterative procedure is repeated until convergence of the exchange bias field $H_{ex}$ amplitude and the exchange angle $\theta_{HeX}$ is achieved. In other words, the iterative procedure is repeated until the variation of the exchange bias field $H_{ex}$ amplitude and the variation of the exchange angle $\theta_{Hex}$ between two consecutive iterations is smaller than a threshold value.

In one aspect, the method further comprises a release step wherein the exposure magnetic field H is removed and the exposure temperature $T_S$ is decreased to a release temperature $T_R$ lower than the exposure temperature $T_S$ (for example at room temperature or 25° C.), during a release time $\tau_R$. During the release time $\tau_R$, the exchange bias field $H_{ex}$ amplitude and the variation of the exchange angle $\theta_{Hex}$ are partially restored towards their initial values (the values before the reference bilayer 244 was exposed to the initial exposure magnetic field $H_{in}$), corresponding to equilibrium values of the exchange bias field $H_{ex}$ amplitude and the variation of the exchange angle $\theta_{Hex}$. The equilibrium values of the exchange bias field $H_{ex}$ amplitude and the variation of the exchange angle $\theta_{Hex}$ represent the degradation of the exchange bias field $H_{ex}$ with the chosen exposure.

The iterative procedure is illustrated for a specific example in FIG. 8. In this example, the reference ferromagnetic layer 21 and the antiferromagnetic layer 24 are exposed, during the initial step, to an initial strong external magnetic field $H_{in}$ oriented at 0° (relative to the reference axis 300) at an initial exposure temperature $T_{in}$ between 290° C. and 310° C., during an initial exposure time $\tau_{Sin}$ (for example 90 min). The strong external magnetic field $H_{in}$ is adapted to saturate the reference layer 21 in the direction of the external magnetic field $H_{in}$. The antiferromagnetic layer 24 acquires an exchange bias field $H_{ex}$ having an amplitude of about 1559 Oe and oriented with an exchange angle $\theta_{Hex}$ of −0.12° (relative to the exchange angle $\theta_{Hex}$ that was set at 0° during the initial step). The small deviation of the exchange angle $\theta_{Hex}$ from 0° to −0.12° is due to the finite number of grains 241 in the antiferromagnetic layer 24. Then, the exposure step is performed, wherein the exposure step comprises applying an exposure magnetic field H of 2 kOe at an exposure angle $\theta_H$ of 90° (relative to the reference axis 300) at an exposure temperature $T_s$ of 100° C. and during an exposure time $\tau_S$ of one hour. In this example, iterating 10 times the exposure step was sufficient to achieve convergence. After convergence, the variation of the exchange angle $\theta_{Hex}$ reaches 3° and the variation of the exchange bias field $H_{ex}$ amplitude is −55 Oe. After performing the release step, the variation of the equilibrium values of exchange angle $\theta_{Hex}$ reaches about 0.58° and the variation of the exchange bias field $H_{ex}$ amplitude is about 35 Oe.

The method disclosed herein can predict changes in the exchange bias field $H_{ex}$ for any in-plane direction of the applied exposure magnetic field H.

The method disclosed herein can be applied to estimate the degradation of the exchange bias field $H_{ex}$ when subjected to a high exposure temperature $T_S$ and an exposure magnetic field H applied at any exposure angle $\theta_H$ over a long period of time τ. Here, a high exposure temperature $T_S$ corresponds to a temperature that is higher than the room temperature (or operating temperature). Indeed, the method calculates the degradation of the magnetic element in conditions that go beyond the normal operational conditions.

FIG. 9 shows an example of a temperature—time (T-τ) diagram of the reference ferromagnetic layer 21 and antiferromagnetic layer 24. The intensity corresponds to the variation of the reference angle $\theta_{FM}$ from an initial value of 0°, after applying an external magnetic field H of 2 kOe at an exposure angle $\theta_H$ of 90°. Time intervals of one and ten years are indicated by the vertical lines. The iterative procedure comprising the release step is applied for each T and $\tau$ point. The diagram reflects the thermal stability of the reference ferromagnetic layer 21 and antiferromagnetic layer 24. The diagram can be used to predict the long-term degradation of the exchange bias field $H_{ex}$ and, therefore, the reduction of accuracy and performance for the magnetic element 2.

In an alternative embodiment, the method comprises, at each iteration, calculating an average variation of the exchange bias field $H_{ex}$amplitude and of the exchange angle $\theta_{HeX}$ by finding an equilibrium state of the reference bilayer 244 by using a statistical Metropolis-Hastings algorithm; adjusting the reference angle $\theta_{FM}$ according to the calculated average variation of the exchange bias field $H_{ex}$ amplitude and of the exchange angle $\theta_{Hex}$.

In one aspect, calculating an average variation of the exchange bias field $H_{ex}$ amplitude and of the exchange angle $\theta_{Hex}$ can comprise:

- setting the energy state of each grain 241;
- calculating an average variation of the exchange bias field $H_{ex}$ amplitude and of the exchange angle $\theta_{Hex}$; and
- aligning the reference magnetization 210 with calculated exchange angle $\theta_{Hex}$.

In one aspect, each grain 241 has a low and high energy minimum of the Néel vector. Here, setting the energy state of each grain 241 can comprise:

- calculating a low lifetime $\tau^-$ for the low energy minimum and a high lifetime $\tau^+$ for the high energy minimum;
- estimate the current lifetime $\tau$ of the current energy state of the grain 241
- if the determined current switching lifetime $\tau$ is larger than the low lifetime $\tau^-$ and smaller than the high lifetime $\tau^+$, setting the grain 241 to the low energy minimum;
- if the determined lifetime $\tau$ is smaller than the low lifetime $\tau^-$, do not change the energy of the grain 241; and
- if the determined current lifetime $\tau$ is larger than the high lifetime $\tau^+$, setting the grain 241 to any of two low or high energy minimum with 50% probability.

The method disclosed herein can further be applied to the case where the reference layer 21 is non-uniformly magnetized. In such case, the reference layer 21 may be divided in a plurality of areas (not shown) where the reference magnetization 210 is considered substantially uniform in each area. In this case, antiferromagnetic grain's energy will depend on a local area magnetization of the reference layer 21. In the iterative procedure, calculating the reference angle $\theta_{FM}$ can comprise performing micromagnetic computation procedure of the whole reference layer (210) including all single-domains areas.

The present disclosure further concerns a computer program product comprising instructions which, when the program is executed by a computer, cause the computer to carry out the method.

Reference Numbers and Symbols

2 magnetic element
21 reference layer
210 reference magnetization
23 sense layer
230 sense magnetization
24 antiferromagnetic layer
240 magnetic moment, Néel vector
241 grain
244 reference bilayer
245 uniaxial anisotropy axis
300 reference axis
$\Omega$ grain volume
$\Omega_0$ critical volume at room temperature
$\Omega_S$ critical volume at setting temperature
$\theta_A$ anisotropy angle
$\theta_H$ exposure angle
$\theta_{Hex}$ exchange angle
$\theta_N$ Néel vector angle
$\theta_{FM}$ reference angle
$\tau$ period of time
$\tau_C$ time elapsed after exposure
$\tau_R$ release time
$\tau_S$ exposure time
$\tau_{Sin}$ initial exposure time
H exposure magnetic field
$H_{ex}$ exchange bias field
$H_{in}$ initial exposure magnetic field
$J_0$ interface coupling constant at OK
$J_E$ interface coupling constant
$K_0$ anisotropy constant at OK
$K_u$ uniaxial anisotropy constant
$M_{FM}$ magnetization direction of reference layer
$\sigma$ standard deviation
$t_{AF}$ thickness of the antiferromagnetic layer
T temperature
$T_0$ room temperature
$T_{act}$ activation temperature
$T_{in}$ initial exposure temperature
$T_{NA}$ cooling temperature
$T_R$ release temperature
$T_S$ exposure temperature
$T_{set}$ setting temperature
$\mu$ mean value

The invention claimed is:

1. Method to calculate performance of a magnetic element comprising a reference bilayer including a ferromagnetic reference layer having a reference magnetization and an antiferromagnetic layer pining the reference magnetization by exchange-bias, the antiferromagnetic layer comprising a metallic polycrystalline material having a grain volume distribution; the method comprising:

- measuring an exchange-bias field of the antiferromagnetic layer at selected exposure temperatures, under selected in-plane exposure magnetic fields applied to the reference bilayer, during an exposure time;
- fitting a grain volume distribution function to the measured exchange-bias fields to determine at least one distribution parameter characterizing the volume distribution of the grains and at least one magnetic parameter characterizing magnetic properties of the antiferromagnetic layer;
- calculating a reference angle corresponding to an in-plane variation in a direction of the reference magnetization, as a function of a direction of the in-plane magnetic field;
- calculating the exchange bias field for any value of the in-plane exposure magnetic field, exposure temperature and exposure time, using the calculated reference angle and determined said at least one distribution and magnetic parameters in the grain volume distribution function.

2. The method according to claim 1, further comprising generating an array of grains using determined said at least one distribution parameter, the array of grains having a volume corresponding to the antiferromagnetic layer.

3. The method according claim 2, wherein each grain has a randomly oriented uniaxial anisotropy.

4. The method according to claim 1, wherein said at least one distribution parameter comprises mean value and standard deviation.

5. The method according to claim 4, wherein calculating the exchange bias field comprises using determined said at least one magnetic parameter in the grain volume distribution function to calculate the grains volumes that contribute to the exchange-bias filed.

6. The method according to claim 1, wherein said at least one magnetic parameter comprises uniaxial anisotropy constant, maximum exchange bias field and Neel temperature of the antiferromagnetic layer.

7. The method according to claim 5, comprising integrating the grain volume distribution function for the grains volumes that contribute to the exchange-bias field.

8. The method according to claim 1, wherein the grain volume distribution function is a lognormal function.

9. The method according to claim 1, wherein the steps of calculating a reference angle and calculating the exchange bias field comprises an iterative procedure including:

calculating the reference angle for an exposure magnetic field oriented at a given exposure angle; and calculating a variation of the exchange bias field amplitude and of the exchange angle;

wherein the iterative procedure is repeated until the variation of the exchange bias field amplitude and of the exchange angle between two consecutive iterations is smaller than a threshold value.

10. The method according to claim 9, further comprising generating an array of grains using determined said at least one distribution parameter, the array of grains having a volume corresponding to the one the antiferromagnetic layer, at each iteration, calculating an average variation of the exchange bias field amplitude and of the exchange angle by finding an equilibrium state of the reference bilayer by using a statistical Metropolis-Hastings algorithm; and adjusting the reference angle according to the calculated average variation of the exchange bias field amplitude and of the exchange angle.

11. The method according to claim 10, wherein calculating an average variation of the exchange bias field amplitude and of the exchange angle comprises:

setting the energy state of each grain;

calculating an average variation of the exchange bias field amplitude and of the exchange angle; and aligning the reference magnetization with calculated exchange angle.

12. The method according to claim 11, wherein each grain has a low and high energy minimum of the Neel vector; wherein setting the energy state of each grain comprises:

calculating a low switching time for the low energy minimum and a high switching time for the high energy minimum;

determining a switching time of the grain;

if the determined switching time is larger than the low switching time and smaller than the high switching time, setting the grain to the low energy minimum;

if the determined switching time is smaller than the low switching time, do not change the energy of the grain;

if the determined switching time is larger than the high switching time setting the grain to any of two low or high energy minimum with 50% probability.

13. A non-transitory computer readable medium storing a program product comprising instructions which, when the program is executed by a computer, cause the computer to carry out the method according to claim 1.

* * * * *